(12) United States Patent
Lin et al.

(10) Patent No.: US 8,759,860 B2
(45) Date of Patent: Jun. 24, 2014

(54) LIGHT EMITTING DIODE PACKAGE AND LENS MODULE USED THEREIN

(75) Inventors: Ming-Yi Lin, Hsinchu (TW); Wen-Chen Hung, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/596,028

(22) Filed: Aug. 27, 2012

(65) Prior Publication Data

US 2013/0146911 A1    Jun. 13, 2013

(30) Foreign Application Priority Data

Dec. 9, 2011  (CN) .......................... 2011 1 0408497

(51) Int. Cl.
*H01L 33/00*  (2010.01)
*H01L 27/15*  (2006.01)

(52) U.S. Cl.
USPC ................. 257/98; 257/81; 257/99; 257/100; 257/E33.061; 257/E33.067

(58) Field of Classification Search
None
See application file for complete search history.

(56) References Cited

U.S. PATENT DOCUMENTS

| 2007/0109952 | A1  | 5/2007  | Jeong et al.              |
|--------------|-----|---------|---------------------------|
| 2009/0159915 | A1* | 6/2009  | Branchevsky ........ 257/98 |
| 2010/0230693 | A1* | 9/2010  | Tran ................ 257/98 |
| 2011/0085336 | A1* | 4/2011  | Blumel et al. ....... 362/255 |
| 2011/0215342 | A1* | 9/2011  | Oliver .............. 257/81 |
| 2012/0300431 | A1* | 11/2012 | You et al. .......... 362/84 |

FOREIGN PATENT DOCUMENTS

| JP | 01-287973 A      | 11/1989 |
| JP | 2007-140524 A    | 6/2007  |
| WO | WO 2011096171 A1 * | 8/2011  |

* cited by examiner

*Primary Examiner* — Julio J Maldonado
*Assistant Examiner* — Harpreet Singh
(74) *Attorney, Agent, or Firm* — Novak Druce Connolly Bove + Quigg LLP

(57) ABSTRACT

An LED package includes an LED die and a lens module. The lens module covers the LED die. Light emitted from the LED die travels through the lens module. The lens module includes a concave lens and a convex lens with a smaller radial dimension than that of the concave lens. The concave lens covers the LED die. The convex lens is attached on a center of a surface of the concave lens away from the LED die. Optical axes of the concave lens and the convex lens are both collinear with a central axis of the LED die. Light from the LED die is diverged by the lens module to a peripheral side of the LED package.

14 Claims, 3 Drawing Sheets

LIGHT EMITTING DIODE PACKAGE AND LENS MODULE USED THEREIN

BACKGROUND

1. Technical Field

The present disclosure generally relates to light emitting devices, and particularly to a light emitting diode package (LED) and a lens module used in the light emitting diode package.

2. Description of Related Art

LEDs are solid state light emitting devices made of semiconductor materials, which are more stable and reliable than other conventional light sources such as incandescent bulbs. Thus, LEDs are being widely used in various fields such as numeral/character displaying elements, signal lights, light sources for lighting and display devices. In use, an LED package is usually provided to obtain color selection, focusing and the like for light emitted by the LEDs.

Generally, a plurality of LEDs are positioned at a lateral side or on a bottom surface of a light guide plate in a backlight module, thereby illuminating the light guide plate. However, a conventional LED die has a light output angle of about 120°, which has an uneven distribution of light field with high light intensity at center thereof and low light intensity at periphery thereof. As such, more LEDs are required to reduce a distance between neighboring LEDs, thereby avoiding dark bands between neighboring LEDs. However, employment of more LEDs will undesirably increase costs thereof.

Therefore, it is necessary to provide an LED package and a lens used in the LED package which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packages, and the present lens used in the LED packages, in detail.

Figure 1:
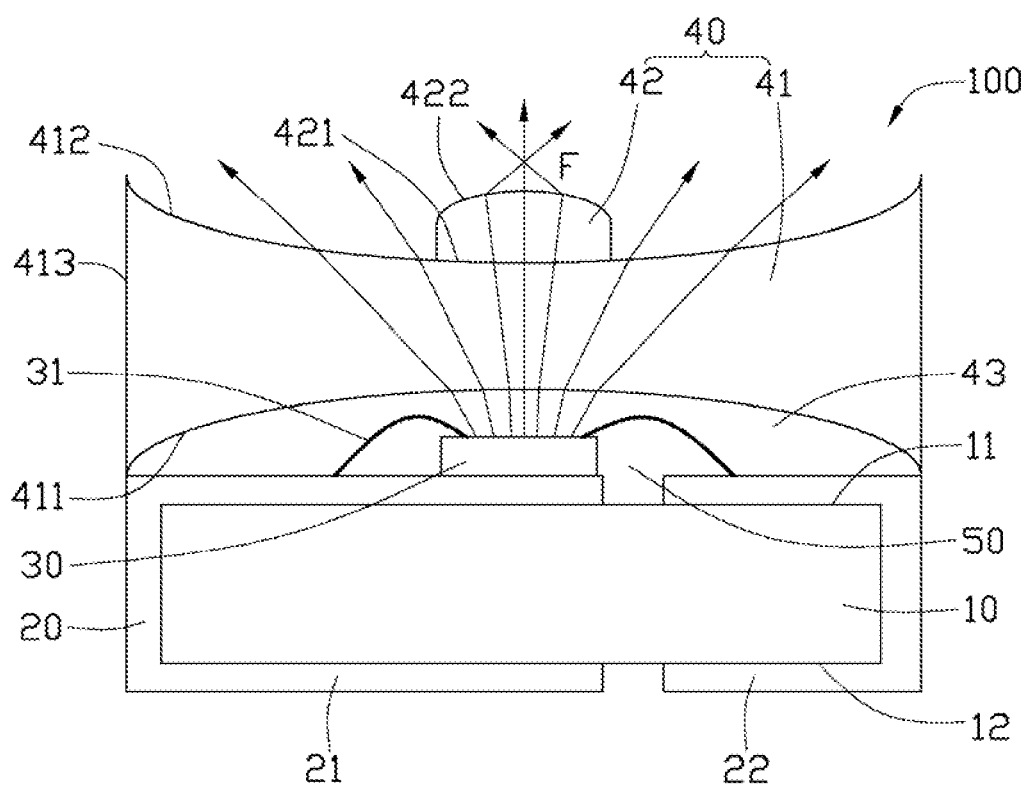
FIG. 1 is a schematic, cross-sectional view of an LED package in accordance with a first embodiment of the present disclosure.

Referring to FIG. 1, an LED package 100 of a first exemplary embodiment includes a substrate 10, a circuit structure 20, an LED die 30, a lens module 40, and an encapsulation 50. The LED die 30 is mounted on the substrate 10 and electrically connected to the circuit structure 20. The encapsulation 50 is configured between the substrate 10 and the lens module 40.

The substrate 10 is used for supporting the LED die 30. The substrate 10 can be made of materials with excellent thermal conductivity and electrical insulation, such as PPA (polyphosphoricacid) or ceramic. The substrate 10 includes a first surface 11 and a second surface 12 away from the first surface 11. In this embodiment, the substrate 10 is rectangular and thin.

The circuit structure 20 is formed on the substrate 10. The circuit structure 20 includes a first electrode 21 and a second electrode 22 spaced from each other. The first and second electrode 21, 22 each extend from a central portion of the first surface 11 to the second surface 12, traversing a corresponding lateral side of the substrate 10. The circuit structure 20 is made of metal with good electric conductivity, such as gold, silver, copper, platinum, aluminum, nickel, tin, magnesium or alloy thereof.

The LED die 30 is mounted on the first surface 11 of the substrate 10, and electrically connected to the first electrode 21 and the second electrode 22 by two metal wires 31. The LED die 30 can be mounted on one of the first and second electrodes 21, 22. In this embodiment, the LED die 30 is mounted on the first electrode 21 by heat-conductive adhesive and electrically connected to the first and second electrodes 21, 22 by the two metal wires 31. Alternatively, the LED die 30 can be arranged on the first surface 11 of the substrate 10 and electrically connected to the circuit structure 20 by flip chip or eutectic bonding. There can be one or more LED dies 30 mounted in the LED package 100 according to actual requirements. In this embodiment, there is one LED die 30.

The lens module 40 covers the LED die 30. Light emitted from the LED die 30 can totally travel through the lens module 40, thereby travelling out of the LED package 100. The lens module 40 includes a concave lens 41 and a convex 42 stacked on the concave lens 41.

The concave lens 41 includes a first concave surface 411, a second concave surface 412 opposite to the first concave surface 411, and sidewalls 413 interconnecting the first concave surface 411 and the second concave surface 412. The concave lens 41 totally covers the substrate 10. Each sidewall 413 is coplanar with a lateral side of the substrate 10. The first concave surface 411 recesses along a direction away from the substrate 10, thereby defining a receiving area 43 between the first concave surface 411 and the first surface 11 of the substrate 10 for receiving the LED die 30, the metal wires 31 and the encapsulation 50. The first concave surface 411 is symmetrical with respect to a central axis of the LED die 30. In other words, an optical axis of the concave lens 41 is coincident with the central axis of the LED die 30. Therefore, the light traveling through the concave surface 411 can also be distributed symmetrically with respect to the central axis of the LED die 30. The second concave surface 412 recesses along a direction towards the substrate 10. That is, the first concave surface 411 and the second concave surface 412 recess towards each other. In this embodiment, the second concave surface 412 is mirror symmetrical to the second concave surface 411 with respect to a horizontal plane between the first and second concave surfaces 411, 412. In other words, the concave lens 41 is a biconcave lens with the first and second concave surfaces 411, 412 having the same curvature. Alternatively, the curvatures of the first and second concave surfaces 411, 412 can be different from each other.

The convex lens 42 is positioned on the second concave surface 412 of the concave lens 41. A size of the convex lens 42 is far smaller than that of the concave lens 41. The convex lens 42 covers a middle portion of the second concave surface 412. The convex lens 42 includes a first convex surface 421 and a second convex surface 422 opposite to each other. The first convex surface 421 of the convex lens 42 is attached to the second concave surface 412 of the concave lens 41. An optical axis of the concave lens 41 is collinear with that of the convex lens 42. The second convex surface 422 is directly above the first convex surface 421. The second convex surface 422 protrudes along a direction away from the first convex surface 421 and connects lateral sides of the convex lens 42 with a rounded peripheral edge. In this embodiment, the optical axes of the concave lens 41 and the convex lens 42 are both collinear with the central axis of the LED die 30. A radius of curvature of the second convex surface 422 is so small that a distance between a focal point of the convex lens 42 and the second concave surface 422 is relatively short. That is, a focal length of the convex lens 42 is short.

Light emitted from the LED die 30 will travel through the concave lens 41 firstly. Due to the central axis of the concave lens 41 collinear with the central axis of the LED die 30, light traveling through the concave lens 41 will be distributed around symmetrically by a first refraction of the concave lens 41, thereby forming a wide light field. More light will travel to the lateral side of the LED package 100, and the light intensity at the lateral side will be enhanced. Part of the light output from a center of the second concave surface 412 travels into the convex lens 42 secondly. A second refraction will occur in the convex lens 42. This part of light will be firstly focused to the focus point F of the convex lens 42 and then travel radially and divergently towards various directions. As such, the light intensity right above the LED die 30 is weakened, and the peripheral light intensity of the LED die 30 is enhanced.

The concave lens 41 and the convex lens 42 can be made from a single piece of glass. Alternatively, the concave lens 41 and the convex lens 42 can be two individual lenses, which are joint together to form a composite lens. The lens module 40 is not limited to be the configuration by the description above. In alternative embodiments, the concave lens 41 can only includes one curved surface, i.e. the first concave surface 411, with the other surface of the concave lens 41 being configured as a planar surface, whereby the concave lens 41 is a plano-concave lens. In this situation, the convex lens 42 only has the second convex surface 422 being configured as a curved surface, and the other surface of the convex lens 42 is also configured as a planar surface, whereby the convex lens 42 is a plano-convex lens. The two flat surfaces of the concave lens 41 and the convex lens 42, facing each other, are attached together.

The encapsulation 50 is filled in the receiving area 43, between the lens module 40 and the substrate 10. The encapsulation 50 covers the LED die 30 and the metal wires 31 to protect the LED die 30 from dust and moisture. The encapsulation 50 is made of silicone or epoxy resin. The encapsulation 30 can include fluorescent materials evenly distributed therein. The fluorescent materials are, for example, YAG (yttrium aluminum garnet), TAG (terbium aluminum garnet), silicate, nitride, nitrogen oxides, phosphide or sulfide. The encapsulation 50 performs a desired color conversion of the light from the LED die 30.

In the present disclosure, the lens module 40 covers the substrate 10 and the LED die 30. The lens module 40 includes the concave lens 41 and the convex lens 42 with collinear optical axes. The light emitted from the LED die 30 travels through the concave lens 41 and be refracted by the concave lens 41 firstly. As such, more light will travel toward the lateral sides of the LED package 100 after the refraction by the concave lens 41. Accordingly, the light intensity at the lateral sides will be increased, and a lighting angle of the LED package 100 is increased. The light output from the center of the second concave surface 412 travels through the convex lens 42 and is refracted by the convex lens 42 to radiate out divergently. Due to the radius of curvature of the second convex lens 42 is small, the focal length of the convex lens 42 is short. The light refracted by the second convex lens 42 will be firstly focused to the focus point F of the convex lens 42 and then be distributed to the lateral sides of the LED package 100 to further enhance the intensity of the output light at the lateral sides of the LED package 100. As such, the light intensity right above the center of the LED package 100 is weakened, and the peripheral light intensity of the LED package 100 is enhanced. By such design the problem of prior art that light intensity is concentrated at a center of the LED package can be effectively resolved.

Figure 2:
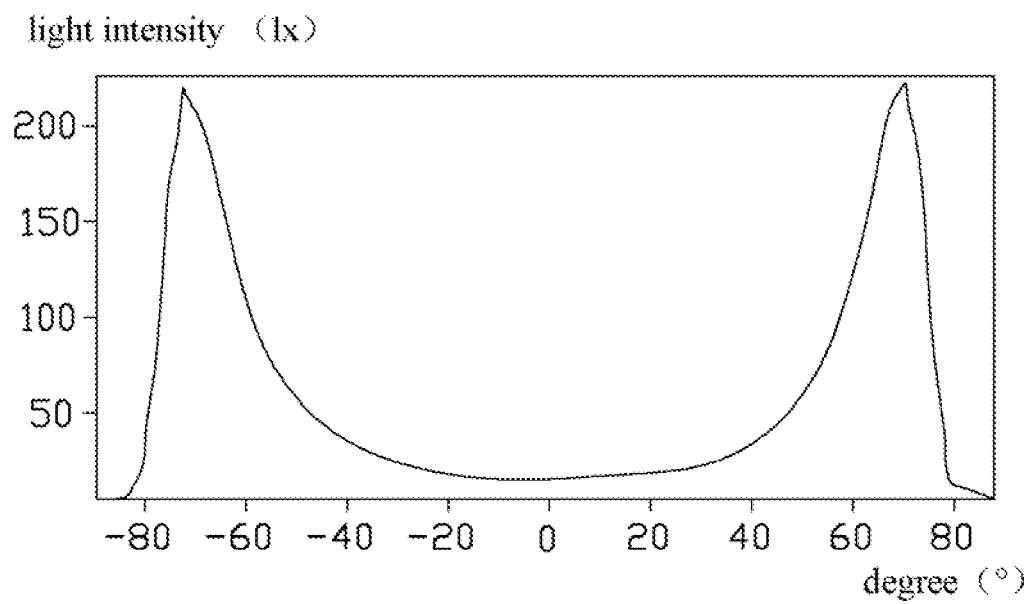
FIG. 2 is a coordinate graph showing a light intensity distribution of the LED package of FIG. 1 at different angles of illumination.

Referring to FIG. 2, a graph having a curve indicating a light intensity (y-axis) versus a light angle (x-axis) of the LED package 100 is shown, wherein the light has the highest intensity at +70° and −70° relative to the central axis of the LED die 30, wherein the central axis is at 0°. From FIG. 2, it can be understood that LED package 100 has enhanced light intensity at a peripheral side thereof. When mounted in a backlight module, less LED packages will be required because of the wide light distribution of the LED package 100 of the present disclosure, and the configuration of present LED package 100 can avoid dark bands between two neighboring LED packages to achieve an even light distribution.

Figure 3:
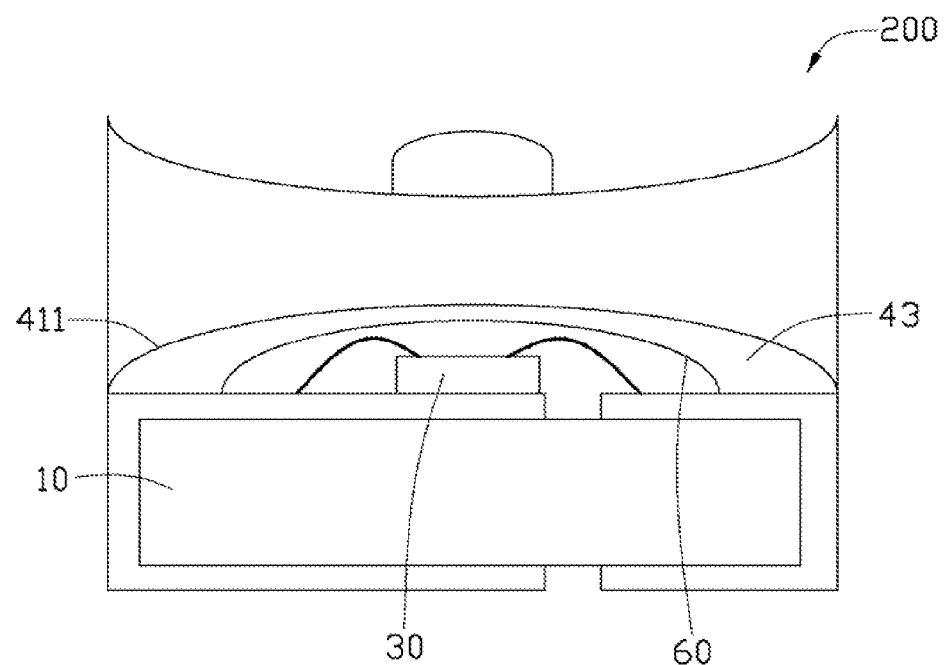
FIG. 3 is a schematic, cross-sectional view of an LED package in accordance with a second embodiment of the present disclosure.

Referring to FIG. 3, an LED package 200 of a second exemplary embodiment is provided. The differences between the light package 200 and the light package 100 of the first embodiment are described below. In this embodiment, an inner lens 60 is positioned in the receiving area 43 between the substrate 10 and the first concave surface 411 of the lens module 40. The inner lens 60 covers the LED die 30 and protrudes away from the substrate 10, thereby forming an upwardly convex configuration. In this embodiment, a radius of curvature of an inner surface of the inner lens 60 is smaller than that of the first concave surface 411 of the concave lens 41. By the inner lens 60, more light from the LED chip 30 can be distributed to the peripheral side of the LED package 200.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:
1. An LED package comprising:
an LED die;
a substrate supporting the LED die, wherein a circuit structure is formed on the substrate, the circuit structure comprises two electrodes spaced from each other, and the LED die is electrically connected to the electrodes; and
a lens module covering the LED die, light emitted from the LED die travelling through the lens module, the lens module comprising a concave lens and a convex lens with a smaller radial dimension than that of the concave lens, the concave lens covering the LED die, the concave lens comprising a first concave face adjacent to the LED die, a second concave face away from the LED die, and a sidewall directly interconnecting the first concave face and the second concave face, the convex lens being attached on the second concave surface of the concave lens away from the LED die, and optical axes of the concave lens and the convex lens are both collinear with a central axis of the LED die, light from the LED die being diverged to a peripheral side of the LED package by the lens module;
wherein the lens module is fixed on the substrate with the LED die received therebetween;

wherein an inner lens covers the LED die, the inner lens being fixed between the concave lens and the substrate, and the inner lens protruding along a direction away from the substrate; and wherein a height of the second concave face keeps increasing from a center of the second concave face to the sidewall aligned with an outer lateral side of the substrate.

2. The LED package of claim 1, wherein the first concave surface recesses away from the LED die.

3. The LED package of claim 2, wherein the first concave surface is symmetrical with respect to the central axis of the LED die.

4. The LED package of claim 2, wherein a receiving area is defined under the first concave surface, and the LED die is received in the receiving area.

5. The LED package of claim 2, wherein the second concave surface is opposite to the first concave surface of the concave lens, and the second concave surface recesses towards the LED die.

6. The LED package of claim 5, wherein the second concave surface is mirror symmetrical to the first concave surface with respect to a horizontal plane between the first concave surface and the second concave surface.

7. The LED package of claim 6, wherein the convex lens is positioned at a middle portion of the second surface of the concave lens.

8. The LED package of claim 7, wherein the convex lens comprises a first convex surface and a second convex surface, the first convex surface is attached to the second concave surface of the concave lens, and the second convex surface is above the first convex surface.

9. The LED package of claim 8, wherein a radius of curvature of the second convex surface is smaller than that of the first concave surface of the concave lens.

10. A lens module for covering an LED chip to diverge light from the LED chip comprising:
a concave lens having a first concave surface for facing the LED chip, a second concave surface opposite the first surface, and a sidewall directly interconnecting the first concave face and the second concave face;
a convex lens having a smaller radial dimension than the concave lens, the convex lens being attached on the second concave surface of the concave lens, and an optical axis of the convex lens is collinear with an optical axis of the concave lens;
a substrate supporting the LED chip;
an inner lens covering the LED die, the inner lens being fixed between the concave lens and the substrate, and the inner lens protruding along a direction away from the substrate; and
wherein a height of the second concave face keeps increasing from a center of the second concave face to the sidewall aligned with an outer lateral side of the substrate.

11. The light emitting device of claim 10, wherein the first concave surface and the second concave surface recess towards each other.

12. The light emitting device of claim 11, wherein the second concave surface is mirror symmetrical to the first concave surface with respect to a horizontal plane between the first concave surface and the second concave surface.

13. The light emitting device of claim 11, wherein the convex lens is positioned at a middle portion of the second concave surface of the concave lens.

14. The light emitting device of claim 13, wherein the convex lens comprises a first convex surface and a second convex surface, the first convex surface is attached to the second concave surface of the concave lens, and the second convex surface is above the first convex surface.

* * * * *